United States Patent
Kim et al.

(10) Patent No.: US 8,482,023 B2
(45) Date of Patent: Jul. 9, 2013

(54) LEADFRAME HAVING A HEAT SINK SUPPORTING PART, FABRICATING METHOD OF A LIGHT EMITTING DIODE PACKAGE USING THE SAME, AND LIGHT EMITTING DIODE PACKAGE FABRICATED BY THE METHOD

(75) Inventors: Do Hyung Kim, Suwon-si (KR); Suk Jin Kang, Seoul (KR); Hyuck Jung Choi, Seoul (KR); Jung Hoo Seo, Seoul (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 34 days.

(21) Appl. No.: 12/304,663

(22) PCT Filed: Jun. 28, 2007

(86) PCT No.: PCT/KR2007/003148
§ 371 (c)(1),
(2), (4) Date: Dec. 12, 2008

(87) PCT Pub. No.: WO2008/002088
PCT Pub. Date: Jan. 3, 2008

(65) Prior Publication Data
US 2009/0189178 A1 Jul. 30, 2009

(30) Foreign Application Priority Data

Jun. 30, 2006 (KR) .................. 10-2006-0060823
Jun. 27, 2007 (KR) .................. 10-2007-0063395

(51) Int. Cl.
*H01L 33/00* (2010.01)
*H01L 23/495* (2006.01)
*H01L 21/50* (2006.01)

(52) U.S. Cl.
USPC .............................. 257/99; 257/675; 438/26

(58) Field of Classification Search
CPC ......... H01L 23/495; H01L 33/00; H01L 21/50; H01L 23/36
USPC ............... 257/99, 675, E23.101, E33.056, 257/E21.499, E23.031; 438/26
See application file for complete search history.

(56) References Cited

U.S. PATENT DOCUMENTS

| 6,274,924 B1 | 8/2001 | Carey et al. |
| 2001/0000924 A1 | 5/2001 | Karnezos et al. |

(Continued)

FOREIGN PATENT DOCUMENTS

| DE | 4017697 | 12/1991 |
| EP | 1139439 | 10/2001 |

(Continued)

OTHER PUBLICATIONS

A Preliminary Notice of First Office Action dated Feb. 23, 2011 issued in connection with TW Application No. 96123754 with an English language translation.

(Continued)

*Primary Examiner* — Walter H Swanson
(74) *Attorney, Agent, or Firm* — H.C. Park & Associates, PLC

(57) ABSTRACT

Disclosed are a leadframe having heat sink supporting parts, a light emitting diode package in which the leadframe is employed, and a fabricating method of a light emitting diode package using the leadframe. The leadframe includes an outer frame surrounding a predetermined region. The heat sink supporting parts extend inward to face each other from the outer frame. Each of the supporting parts has an end portion coupled to a heat sink. Further, lead terminals extend inward to face each other from the outer frame. The lead terminals are spaced apart from the supporting parts. Accordingly, a package main body can be formed by an insert molding technique after the heat sink is coupled to the end portions of the supporting parts, and the heat sink and the lead terminals can be easily aligned.

21 Claims, 4 Drawing Sheets

U.S. PATENT DOCUMENTS

| | | |
|---|---|---|
| 2003/0168720 A1 | 9/2003 | Kamada |
| 2004/0075100 A1 | 4/2004 | Bogner et al. |
| 2004/0126913 A1 | 7/2004 | Loh |
| 2004/0135156 A1 | 7/2004 | Takenaka |
| 2005/0236638 A1 | 10/2005 | Tsukagoshi |
| 2005/0269589 A1 | 12/2005 | Wu |
| 2006/0102917 A1 | 5/2006 | Oyama et al. |
| 2006/0103012 A1 | 5/2006 | Chin |
| 2006/0133044 A1 | 6/2006 | Kim et al. |
| 2006/0267036 A1* | 11/2006 | Lee et al. .................. 257/98 |
| 2007/0063321 A1* | 3/2007 | Han et al. ................. 257/675 |
| 2009/0053839 A1* | 2/2009 | Kim et al. ................. 438/26 |

FOREIGN PATENT DOCUMENTS

| | | |
|---|---|---|
| EP | 1816688 | 8/2007 |
| EP | 1970968 | 9/2008 |
| JP | 51-8783 | 3/1976 |
| JP | 61-061445 | 3/1986 |
| JP | 01-270336 | 10/1989 |
| JP | 04-230056 | 8/1992 |
| JP | 2002-280616 | 9/2002 |
| JP | 2006-080288 | 3/2006 |
| JP | 2006-093470 | 4/2006 |
| JP | 2006-173155 | 6/2006 |
| JP | 2006-173561 | 6/2006 |
| TW | 1227935 | 2/2005 |
| WO | 02/084749 | 10/2002 |
| WO | 03/005458 | 1/2003 |
| WO | 2004/001862 | 12/2003 |
| WO | 2005/098975 | 10/2005 |
| WO | 2005/101446 | 10/2005 |
| WO | 2006/065007 | 6/2006 |
| WO | WO 2006/095949 * | 9/2006 |

OTHER PUBLICATIONS

Extended European Search Report of EP07 76 8519 issued on Feb. 18, 2011.

German Office Action of file reference 11 2007 000 055.4-33 issued on Dec. 16, 2010.

The State Intellectual Property Office of P.R. China Decision of Rejection issued on Feb. 17, 2012 for Chinese Application No. 200780014568.7.

English Translation of German Office Action issued to Related German Application No. 11 2007 000 055.4, dated Nov. 20, 2012.

* cited by examiner (a)

(b)

LEADFRAME HAVING A HEAT SINK SUPPORTING PART, FABRICATING METHOD OF A LIGHT EMITTING DIODE PACKAGE USING THE SAME, AND LIGHT EMITTING DIODE PACKAGE FABRICATED BY THE METHOD

CROSS REFERENCE TO RELATED APPLICATIONS

This application is the National Stage of International Application No. PCT/KR2007/003148, filed Jun. 28, 2007, and claims priority from and the benefit of Korean Patent Application No. 10-2006-0060823, filed on Jun. 30, 2006, and Korean Patent Application No. 10-2007-0063395, filed on Jun. 27, 2007, which are both hereby incorporated by reference for all purposes as if fully set forth herein.

BACKGROUND OF THE INVENTION

1. Field of the Invention

The present invention relates to a leadframe, a fabricating method of a light emitting diode package using the leadframe and a light emitting diode package by the method, and more particularly, to a leadframe having a supporting part capable of fixing a heat sink to the leadframe before forming a package main body by an insert molding technique so as to align the heat sink and the leadframe, a fabricating method of a light emitting diode package using the leadframe and a light emitting diode package by the method.

2. Discussion of the Background

In order to use a light emitting diode (LED) as a light source for illumination, the LED is required to have luminous power of a few tens lumens. The luminous power of the LED is generally in proportion to input power. Accordingly, high luminous power can be obtained by increasing power input to the LED. However, the increase of the input power causes junction temperature of the LED to increase. The increase of the junction temperature of the LED results in decrease of photometric efficiency indicating a degree where input energy is converted into visible light. Therefore, the LED is required to have a structure for preventing the increase of the junction temperature of the LED due to the increase of the input power.

An LED package provided with such a structure has been disclosed in U.S. Pat. No. 6,274,924(B1) (Title: Surface mounting LED package). According to the document, since an LED die is thermally coupled on a heat sink, the LED die can be maintained at a low junction temperature. Accordingly, relatively high input power is supplied to the LED die, so that high luminous power can be obtained.

However, since the conventional LED package is fabricated by forming a package main body and then inserting a heat sink into the package main body, there is a problem in that the heat sink may be easily separated from the package main body. Meanwhile, an LED package may be fabricated by aligning a heat sink and lead terminals and then forming a package main body for supporting the heat sink and the lead terminals through an insert molding technique. However, since the lead terminals and the heat sink are separated from one another in the conventional LED, it is difficult to align the lead terminals and the heat sink with each other.

SUMMARY OF THE INVENTION

An object of the present invention is to provide an LED package with a superior heat radiation characteristic, in which although there is high input power, junction temperature of an LED die can be prevented from increasing, and thus high luminous power can be obtained.

Another object of the present invention is to provide an LED package capable of easily aligning lead terminals and a heat sink.

A further object of the present invention is to provide a leadframe, wherein lead terminals and a heat sink can be easily aligned, and thus an LED package can be easily fabricated.

In order to achieve these objects, the present invention provides a leadframe having heat sink supporting parts, a fabricating method of a light emitting diode (LED) package using the same, and an LED package fabricated through the method.

The leadframe according to an aspect of the present invention includes an outer frame surrounding a predetermined region. Heat sink supporting parts extend inward to face each other from the outer frame. Each of the supporting parts has an end portion to be coupled to a heat sink. Further, lead terminals extend inward to face each other from the outer frame. The lead terminals are spaced apart from the supporting parts. Accordingly, a package main body can be formed by an insert molding technique after a heat sink is coupled to the end portions of the supporting parts, and the heat sink and the lead terminals can be easily aligned.

Each of the lead terminals has an inner lead arranged around the heat sink and an outer lead extending from the inner lead. In some embodiments of the present invention, each of the inner leads may extend along a circumference of the heat sink between the supporting parts. Such inner leads provide a sufficient region in which wires will be bonded thereto. In addition, each of the end portions of the supporting parts may extend along the circumference of the heat sink between the inner leads. The extending end portions cause a contact surface contacting the heat sink to be increased thereby stably supporting the heat sink, and prevent the supporting parts from being separated from the package main body. Further, the supporting parts may be bent so that the end portions of the supporting parts are positioned lower than those of the lead terminals. The bent portions of the supporting parts are buried in the package main body to prevent the supporting parts from being separated from the package main body.

A method of fabricating an LED package according to another aspect of the present invention includes preparing a leadframe. The leadframe includes an outer frame surrounding a predetermined region. Heat sink supporting parts extend inward to face each other from the outer frame. Each of the supporting parts has an end portion to be coupled to a heat sink. Further, lead terminals extend inward to face each other from the outer frame. The lead terminals are spaced apart from the supporting parts. Meanwhile, the heat sink is coupled and fixed to the supporting parts. Thereafter, a package main body for supporting the heat sink, the supporting parts and the lead terminals is formed thereon by an insert molding technique. The package main body has an opening for exposing a top end portion of the heat sink and portions of the lead terminals. According to this aspect, since the heat sink is coupled and fixed to the supporting parts, the lead terminals and the heat sink are self-aligned. Therefore, the heat sink and the lead terminals are aligned without an additional means for aligning them, so that an LED can be easily fabricated.

An LED die is mounted on a top surface of the heat sink, and the LED die is electrically connected to the lead terminals through bonding wires. Subsequently, a molding member for encapsulating the LED die and the bonding wires is formed. The molding member may be formed in the shape of a lens. The molding member may comprise a first molding member for encapsulating the LED die and portions of the bonding wires and a second molding member for encapsulating the entire of the first molding member and the bonding wires.

Meanwhile, the package main body may be formed such that the top surface of the heat sink is located at a position identical to or higher than that of the package main body. Thus, the LED die mounted on the top surface of the heat sink is located at a position higher than the top surface of the package main body. Accordingly, light emitted from the LED die is prevented from being absorbed and lost in an inner wall of the package main body, so that light emitting efficiency of the LED die can be enhanced. Further, since an influence of the package main body is eliminated, the path (such as viewing angle, light distribution or the like) of light emitted from the LED die can be easily controlled using the molding member or another lens.

Meanwhile, the outer frame is removed, and the supporting parts and the lead terminals that are outside the package main body are cut and formed, thereby completing an LED package.

An LED package according to a further aspect of the present invention includes a heat sink. Supporting parts are coupled to the heat sink. Each of the supporting parts has an end portion coupled to the heat sink. Meanwhile, lead terminals are spaced apart from the supporting parts and the heat sink and arranged at both sides of the heat sink. A package main body supports the heat sink, the supporting parts and the lead terminals by being formed thereon by a molding. The package main body has an opening for exposing a top end portion of the heat sink and portions of the lead terminals. Accordingly, the supporting parts and the heat sink are coupled to each other, so that the heat sink can be prevented from being separated from the package main body.

Meanwhile, the heat sink may comprise a body part and a projection protruding from a side surface of the body part. The projection is buried in the package main body, and the supporting parts are coupled to the body part.

Further, the heat sink may have a supporting part receiving groove for accommodating end portions of the supporting parts. The supporting part receiving groove accommodates the end portions of the supporting parts, whereby the supporting parts are stably coupled to the heat sink.

Meanwhile, a top surface of the body part of the heat sink may be located at a position identical to or higher than that of the package main body. Accordingly, the LED die mounted on the top surface of the body part of the heat sink is located at a position higher than that of the package main body, whereby light loss due to the light absorption of the package main body can be reduced and the path of light emitted to the outside can be easily controlled.

In the meantime, the heat sink may have a reflective cup positioned on the body part. The reflective cup reflects light emitted from the LED die to increase luminous intensity of the emitted light within a narrow viewing angle range.

The package main body is formed of plastic resin by injection molding thermosetting or thermoplastic resin after coupling the supporting parts and the heat sink. Thus, a package main body having a complicated structure can be easily formed, and the package main body can be securely coupled to the heat sink.

Meanwhile, each of the supporting parts may have a bent portion. Thus, end portions of the supporting parts coupled to the heat sink are positioned lower than the lead terminals. In the meantime, the bent portion is buried in the package main body. Accordingly, the bent portion causes the supporting parts to be prevented from being separated from the package main body.

Each of the lead terminals has an outer lead protruding from the package main body to the outside thereof. The outer leads may be bent to a bottom surface of the package main body along a sidewall of the package main body. Accordingly, a mounting surface of the LED package can be minimized.

Meanwhile, an LED die is mounted on a top surface of the heat sink. The LED die may be mounted in the reflective cup. In the meantime, the LED die and the lead terminals are electrically connected through bonding wires. In addition, molding resin may encapsulate the LED die and the bonding wires. The molding resin may have various shapes, e.g., a convex lens shape.

According to the embodiments of the present invention, it is possible to provide an LED package having a superior heat radiation characteristic and thus obtaining high luminous power by employing a heat sink. Further, after a heat sink is coupled and fixed to supporting parts, a package main body can be formed by an insert molding technique, so that lead terminals and the heat sink can be easily aligned and the heat sink can be prevented from being separated from the package main body. Furthermore, although the heat sink supporting parts are employed, the increase of the spacing distance between the lead terminals and the heat sink can be prevented, so that the increase of the size of the LED package can be prevented.

DETAILED DESCRIPTION OF THE ILLUSTRATED EMBODIMENTS

Hereinafter, preferred embodiments of the present invention will be described in detail with reference to the accompanying drawings.

Figure 1:
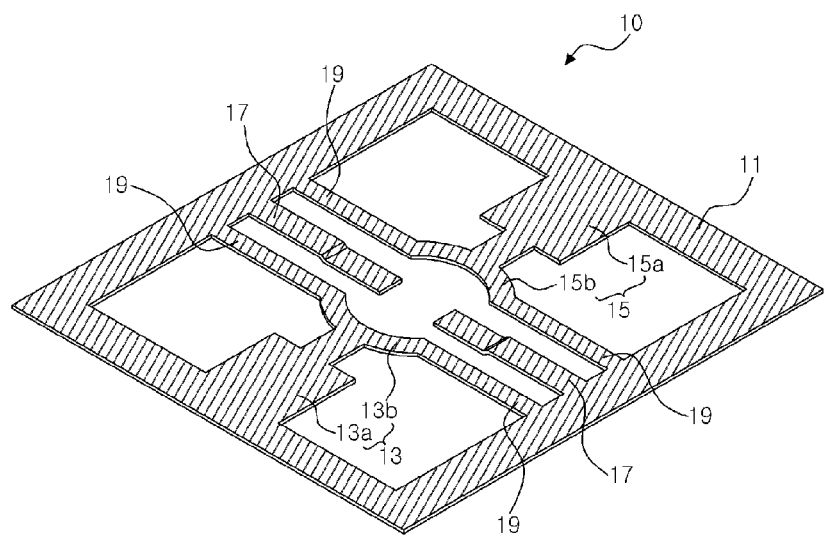
FIG. 1 is a perspective view illustrating a leadframe according to an embodiment of the present invention.

FIG. 1 is a perspective view illustrating a leadframe 10 according to an embodiment of the present invention.

Referring to FIG. 1, the leadframe 10 has an outer frame 11 surrounding a predetermined region. The predetermined region includes a region in which a heat sink is positioned. As shown in the figure, the outer frame 11 is in the shape of a rectangle. However, the outer frame 11 is not limited thereto but may be in the shape of a circle or another polygon.

Heat sink supporting parts 17 extend inward to face each other from the outer frame 11. Each of the supporting parts 17 has an end portion coupled to the heat sink. Further, lead terminals 13 and 15 extend inward to face each other from the outer frame 11. The lead terminals 13 and 15 are spaced apart from the supporting parts 17.

The lead terminals 13 and 15 have outer leads 13a and 15a and inner leads 13b and 15b, respectively. The inner leads 13b and 15b are arranged around a region in which the heat sink will be positioned. The outer leads 13a and 15a respectively extend outward from the inner leads 13b and 15b to be connected to the outer frame 11. As shown in this figure, each of the outer leads 13a and 15a may have a broad width in order to increase a mounting surface thereof. Portions at which the inner and outer leads are connected to each other may be formed to have a narrow width such that the leads are easily bent.

Meanwhile, the inner leads 13b and 15b may extend along a circumference of the heat sink between the supporting parts 17. The extending inner leads 13b and 15b provides sufficient regions in which wires can be bonded thereto. Connection parts 19 for connecting the outer frame 11 to the inner leads 13b and 15b may be provided such that the extending inner leads 13b and 15b are stably fixed to the outer frame 11.

The supporting parts 17 may be bent such that the end portions thereof are positioned lower than those of the lead terminals 13 and 15. The bent portions of the supporting parts 17 are buried in a package main body to prevent the supporting parts 17 from being separated from the package main body.

The necessary number of the lead terminals 13 and 15 may be determined depending on the kind and number of light emitting diode (LED) dies and a bonding wire connection method. The leadframe 10 may have a large number of lead terminals so as to be used in a variety of cases.

The leadframe 10 according to the embodiment of the present invention can be fabricated by pressing a plate made of phosphor bronze, which is a copper alloy. Meanwhile, although the single leadframe 10 is shown in FIG. 1, a plurality of the leadframes 10 may be fabricated and arranged from a phosphor bronze plate. In particular, a plurality of leadframe 10 fabricated from a phosphor bronze plate are used for mass production of LED packages.

Figure 2:
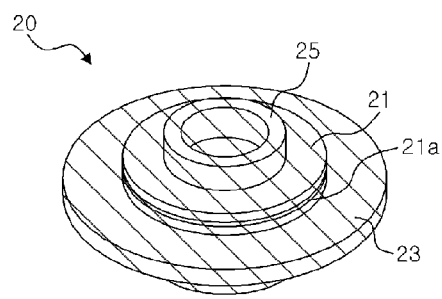
FIG. 2 is a perspective view illustrating a heat sink according to the embodiment of the present invention.

FIG. 2 is a perspective view illustrating a heat sink 20 used in the LED package according to the embodiment of the present invention.

Referring to FIG. 2, the heat sink 20 comprises a body part 21 and a projection 23 protruding from a side surface of the body part 21. Although the body part 21 is in the shape of a cylinder as shown the figure, it is not limited thereto but may be in the shape of a polygonal column. Although the projection 23 may have a shape similar to the body part 21, it is not limited thereto. That is, projections may restrictively protrude from portions of the body part 21.

Further, the heat sink 20 may have a supporting part receiving groove 21a for accommodating the supporting parts 17. The supporting part receiving groove 21a is formed on the side surface of the body part 21. Although the supporting part receiving groove 21a is formed in the shape of a circle along the side surface of the body part 21 as shown in the figure, it is not limited thereto. That is, supporting part receiving grooves may be restrictively formed on portions of the body part 21 so that the supporting parts 17 are accommodated therein.

Furthermore, the heat sink 20 may have a reflective cup 25 on a top surface of the body part 21. An LED die is mounted in the reflective cup 25, and luminous intensity is increased within a narrow viewing angle range by the reflective cup 25.

The heat sink 20 can be fabricated from metal with high thermal conductivity or thermal conductive resin using a pressing or molding process. Further, the heat sink 20 is fabricated using a separate process from the process of fabricating the leadframe 10.

Figure 5:
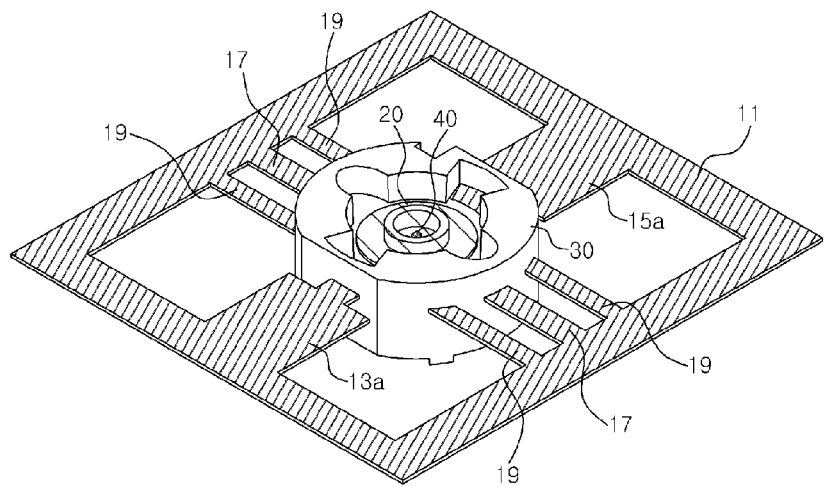
Figure 6:
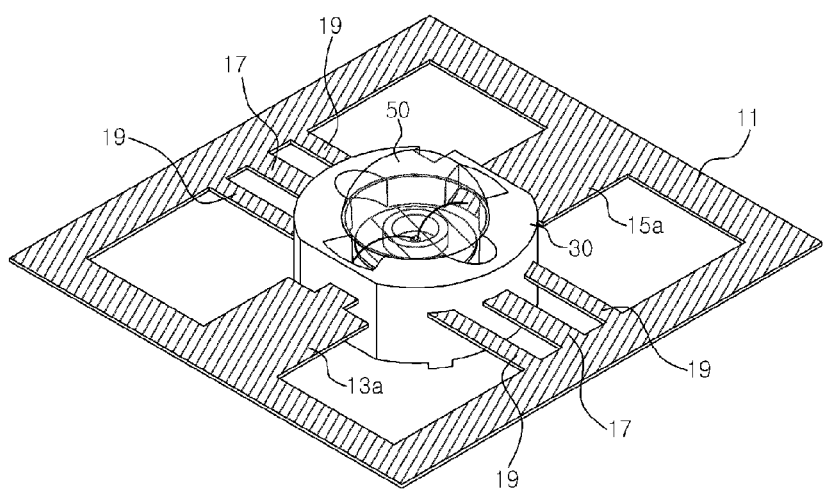
Figure 7:
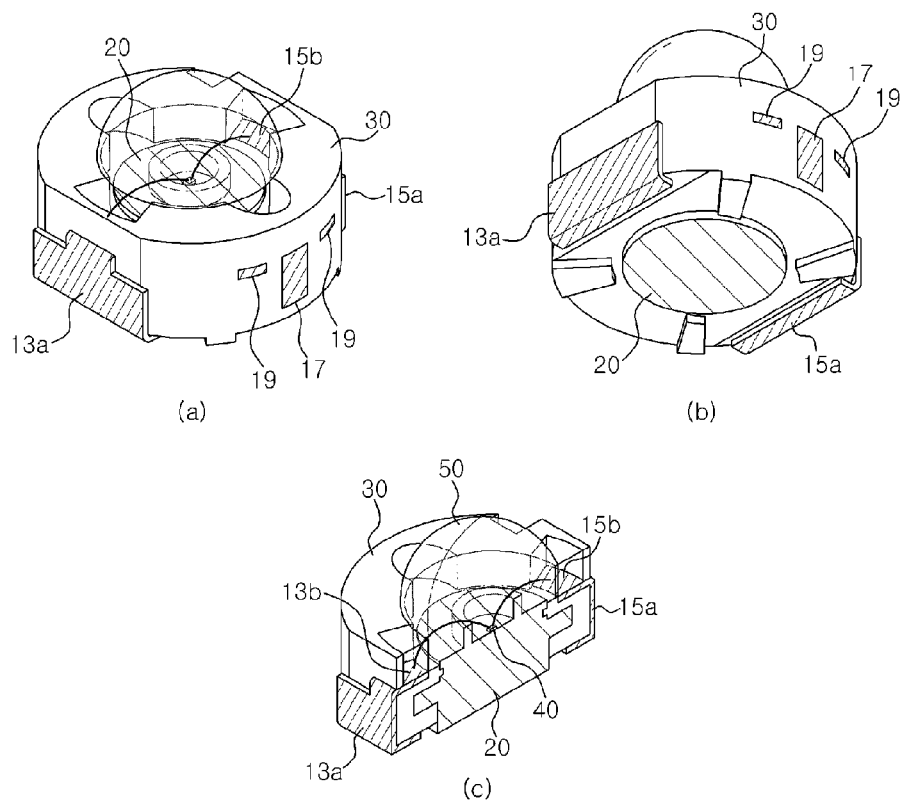
FIGS. 7(a) to 7(c) are perspective views and a sectional perspective view illustrating the LED package according to the embodiment of the present invention.

FIGS. 3 to 6 are perspective views illustrating a fabricating method of the LED package according to the embodiment of the present invention, and FIG. 7 shows perspective views and a sectional perspective view illustrating the LED package completed through the fabricating method according to the embodiment of the present invention.

Figure 3:
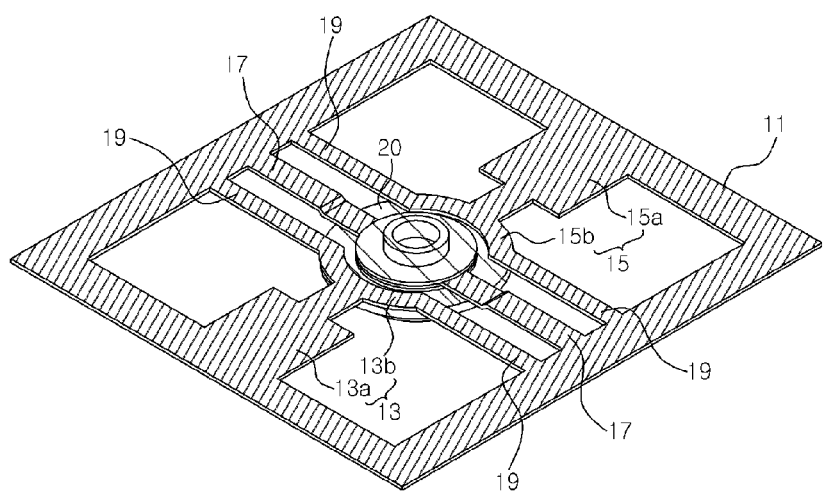
FIGS. 3 to 6 are perspective views illustrating a fabricating method of a light emitting diode (LED) package according to the embodiment of the present invention.

Referring to FIG. 3, the heat sink 20 is coupled and fixed to the supporting parts 17 of the leadframe 10. In a case where the supporting part receiving groove 21a is formed, the end portions of the supporting parts 17 are accommodated in the supporting part receiving groove 21a to support the heat sink 20. At this time, the lead terminals 13 and 15 are spaced apart from the heat sink 20.

Figure 4:
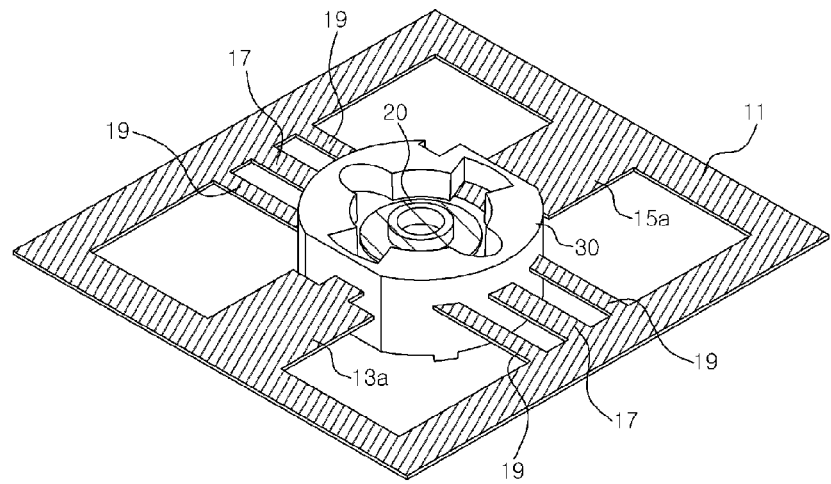

Referring to FIG. 4, the heat sink 20 is fixed to the leadframe 10, and a package main body 30 is then formed by an insert molding technique. The package main body 30 may be formed by injection molding thermosetting or thermoplastic resin.

The package main body 30 is formed around the heat sink 20 to support the supporting parts 17, the connection parts 19, the lead terminals 13 and 15, and the heat sink 20. Portions of the supporting parts 17 and the lead terminals 13 and 15, i.e., the outer leads 13a and 15a, protrude to the outside of the package main body 30. Further, the package main body 30 has an opening for exposing a top end portion of the heat sink 20 and portions of the lead terminals, i.e., portions of inner leads 13b and 15b.

Portions of the supporting parts 17 may be exposed through the opening. However, in a case where the supporting parts 17 are bent, the bent portions and end portions of the supporting parts 17 are buried in the package main body 30.

A bottom surface of the heat sink 20 is exposed to the outside. The projection 23 is buried in the package main body 30 to prevent the heat sink 20 from being separated from the package main body 30.

Meanwhile, although the top surface of the heat sink 20 is positioned lower than that of the package main body 30, the present invention is not limited thereto. In some embodiments, the top surface of the heat sink 20, i.e., the top surface of the body part (21 of FIG. 2) of the heat sink 20, is located at a position identical to or higher than that of the package main body 30.

Since the heat sink 20 is coupled to the leadframe 10 and the package main body 30 is then formed by injection molding thermosetting or thermoplastic resin, a package main body with various shapes can be easily formed and the heat sink 20 can be securely coupled to the package main body 30.

Referring to FIG. 5, an LED die 40 is mounted on the top surface of the heat sink 20. The LED die 40 may be a one-bond die with an electrode on each of top and bottom surfaces thereof or a two-bond die with two electrodes on a top surface thereof.

In a case where the LED die 40 is a one-bond die, the heat sink 20 may be made of a metallic material with electric conductivity. At this time, the LED die 40 is mounted on the heat sink 20 through electric conductive adhesive such as silver (Ag) epoxy. Alternatively, in a case where the LED die 40 to be mounted on the heat sink 20 is a two-bond die, the heat sink 20 is not necessarily to be electrically conductive, and the LED die 40 may be mounted on the heat sink 20 by means of various kinds of thermally conductive adhesives as well as the silver epoxy.

Meanwhile, a plurality of the LED dies 40 may be mounted on the heat sink 20. Further, the plurality of LED dies 40 may be LEDs that can emit light with different wavelengths. At this time, the LED dies 40 may be LEDs for respectively emitting red, green and blue light. Accordingly, the LED package emitting light of all kinds of colors can be provided using the LED dies 40.

Referring to FIG. 6, the LED die 40 and the inner leads 13b and 15b are electrically connected through bonding wires. In a case where the LED die 40 is a two-bond die, the LED die 40 is connected to the inner leads 13b and 15b through two bonding wires as shown in the figure. Meanwhile, in a case where the LED die 40 is a one-bond die, any one of the inner leads, e.g., the inner lead 15b, is electrically connected to the heat sink 20 through a bonding wire. Thus, the inner lead 15b is electrically connected to a bottom surface of the one-bond die through the bonding wire and the heat sink 20.

Meanwhile, after the LED die 40 and the lead terminals 13 and 15 are electrically connected through the bonding wires, a molding member 50 for encapsulating the LED die 40 and the bonding wires is formed. The molding member 50 may encapsulate the LED die 40 and the bonding wires by filling in the opening of the package main body 30. In addition, the molding member 50 may comprise a first molding member restricted on the heat sink 20 to encapsulate the LED die 40 and a second molding member for encapsulating the entire of the first molding member and the bonding wires.

Further, the molding member 50 may contain a phosphor. The phosphor may be contained in the first and/or second molding member. For example, the phosphor may convert color of light from blue into yellow, or into green and red. Thus, if an LED die emitting blue light is mounted on the heat sink 20, it is possible to provide an LED package emitting white light to the outside by partially converting the light emitted from the LED die into yellow, or green and red light. In addition, the molding member may further contain a diffusing material. The diffusing material diffuses light emitted from the LED die 40 to prevent the LED die 40 and the bonding wires from being viewed from the outside and also enables light to be uniformly emitted to the outside.

The molding member 50 may be formed in various shapes. As shown in the figure, the molding member 50 may be formed in the shape of a convex lens. Meanwhile, the molding member 50 is restricted in the opening of the package main body 30, and a lens may be attached to the top surface of the molding member 50.

Referring to FIG. 7(a), the outer frame 11 is removed and the lead terminals 13 and 15 are then bent, thereby forming leads that can be surface mounted. At this time, the lead terminals 13 and 15 may be bent along a side surface of the package main body 30 and then bent toward the outside of the package main body 30. Otherwise, as shown in the figure, the lead terminals 13 and 15 may be bent toward a bottom of the package main body 30.

Meanwhile, the connection parts 19 and the supporting parts 17 that extrude to the outside of the package main body 30 are cut off and removed. At this time, the supporting parts 17 may be bent along the side of the package main body 30 to serve as a heat radiation path. As a result, the LED package that can be surface mounted is completed.

Hereinafter, the LED package according to the embodiment of the present invention will be described in detail with reference to FIGS. 7(a) to 7(c).

Referring to FIGS. 7(a) to 7(c) again, the LED package includes the heat sink 20. As described with reference to FIG. 2, the heat sink 20 has the body part 21 and the projection 23. The heat sink 20 may have the supporting part receiving groove 21a. Further, the reflective cup 25 may be positioned on the top surface of the heat sink 20.

Meanwhile, the heat sink supporting parts 17 are coupled to the heat sink 20. The end portions of the supporting parts 17 are coupled to the heat sink 20, and the end portions may be accommodated in the supporting part receiving groove 21a to be coupled to the heat sink. Further, the lead terminals 13 and 15 are spaced apart from the supporting parts 17 and the heat sink 20 to be positioned at both sides of the heat sink 20. The lead terminals 13 and 15 have the outer leads 13a and 15a and the inner leads 13b and 15b, which protrude to the outside of the package main body 30, respectively. Each of the inner leads 13b and 15b may extend along the circumference of the heat sink 20 between the supporting parts 17.

The package main body 30 is formed on and supports the heat sink 20, the supporting parts 17 and the lead terminals 13 and 15 by a molding. The package main body 30 may be formed of plastic resin by injection molding thermosetting or thermoplastic resin after the heat sink 20 is coupled and fixed to the supporting parts 17. The package main body 30 has the opening for exposing the top end portion of the heat sink 20 and the portions of the lead terminals 13 and 15, i.e., the inner leads 13b and 15b.

Meanwhile, as shown in FIG. 7(b), the body part of the heat sink 20 protrudes from a bottom surface of the package main body 30. Accordingly, heat radiation can be easily performed through the heat sink 20. Further, although the outer leads 13a and 15a may be bent to the bottom surface of the package main body 30 so as to be surface mounted, they are not limited thereto but may be bent to the outside of the package main body 30. Furthermore, the supporting parts 17 that protrude to the outside of the package main body 30 may be cut off and removed. However, the supporting parts 17 may be bent toward the sidewall of the package main body 30. Meanwhile, connection parts 19 that protrude to the outside of the package main body 30 are cut off and removed.

The LED die 40 is mounted on the top surface of the heat sink 20. The LED die 40 may be mounted in the reflective cup 25, and is electrically connected to the inner leads 13b and 15b through the bonding wires. Although the LED die 40 shown therein illustrates a two-bond die, it is not limited thereto. That is, the LED die 40 may be a one-bond die. Further, a plurality of the LED dies 40 may be mounted on the heat sink 20, and a zener diode (not shown) for preventing an electrostatic discharge may be mounted thereon.

Meanwhile, although the top surface of the heat sink 20 is positioned lower than that of the package main body 30, the present invention is not limited thereto. In some embodiments, the top surface of the heat sink 20, i.e., the top surface of the body part (21 of FIG. 2) of the heat sink 20, is located at a position identical to or higher than that of the package main body 30. At this time, the LED die 40 mounted on the top surface of the heat sink 20 is located at a position higher than the top surface of the package main body 30. Accordingly, light emitted from the LED die 40 radiates directly to the package main body 30, so that light can be prevented from being absorbed and lost by the package main body 30.

The molding member 50 encapsulates the LED die 40 and the bonding wires. The molding member 50 encapsulates the LED die 40 by filling in the opening of the package main body 30. As shown in this figure, the molding member 50 may be formed in the shape of a lens. The molding member 50 may comprise the first and second molding members. Further, the molding member 50 encapsulates the LED die 40 by filling in the opening of the package main body 30, and a lens (not shown) may be attached on the molding member 50. In particular, if the LED die 40 is located at a position higher than the top surface of the package main body 30, light emitted from the LED die 40 is not reflected by the package main body 30 but can radiate through the molding member 50 and the lens. Accordingly, the path (destination angle, light distribution or the like) of light emitted from the LED die 40 can be easily controlled by the molding member 50 or the lens.

Meanwhile, the molding member 50 may contain a phosphor, and thus various lights, e.g., white light, can be implemented. The phosphor may be applied before forming the molding member 50 or after forming the molding member 50. Further, the molding member 50 may contain a diffusing material.

Figure 8:
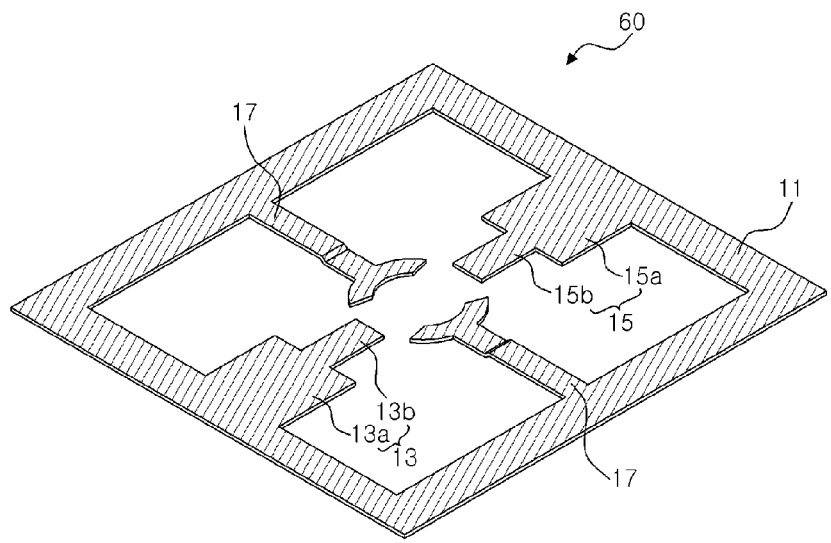
FIGS. 8(a) and 8(b) are perspective views illustrating leadframes according to another embodiment of the present invention.
Figure 8:
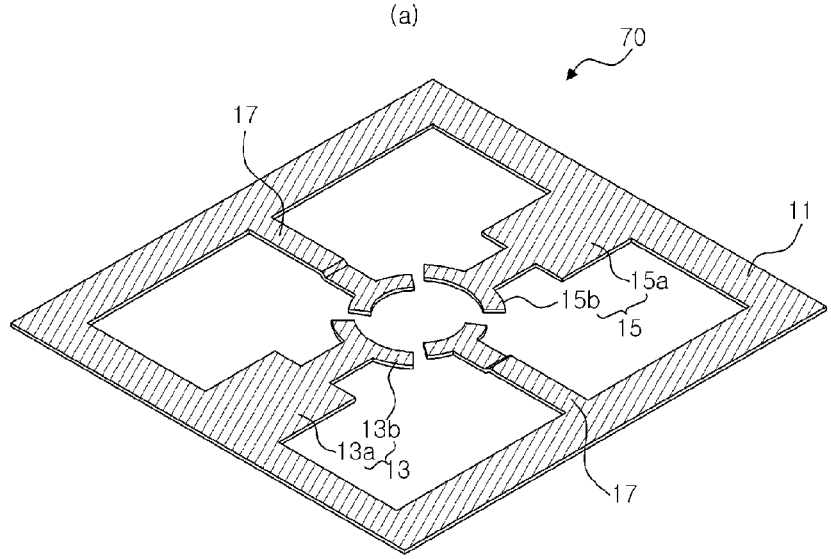

FIGS. 8(a) and 8(b) are perspective views illustrating leadframes 60 and 70 according to another embodiment of the present invention.

Referring to FIG. 8(a), the leadframe 60 has supporting parts 17 and lead terminals 13 and 15, as described with reference to FIG. 1. However, on the contrary to the leadframe 10 of FIG. 1, end portions of the lead terminals 13 and 15 extend along a circumference of a heat sink, whereas end portions of the supporting parts 17 extend along the circumference of the heat sink between the lead terminals 13 and 15. The extending end portions cause a contact surface contacting the heat sink to be increased thereby stably supporting the heat sink, and prevent the supporting parts 17 from being separated from a package main body. Meanwhile, connection parts (not shown) can connect the extending end portions of the supporting parts 17 to an outer frame 11 to thereby support the end portions of the supporting parts 17.

Referring to FIG. 8(b), the leadframe 70 has supporting parts 17 and lead terminals 13 and 15, as described with reference to FIG. 1. However, on the contrary to the leadframe 10 of FIG. 1, end portions of the lead terminals 13 and 15 extend along a circumference of a heat sink, and end portions of the supporting parts 17 extend along the circumference of the heat sink between the lead terminals 13 and 15. Accordingly, the extending end portions of the lead terminals 13 and 15 can provide a sufficient bonding region of bonding wires. The extending end portions of the supporting parts 17 can cause a contact surface contacting the heat sink to be increased to stably support the heat sink, and the supporting parts 17 can be prevented from being separated from a package main body. Further, connection parts (not shown) can connect the extending end portions of the supporting parts 17 to an outer frame 11 to thereby support the end portions of the supporting parts 17, and connect the end portions of the leadframes 13 and 15 to the outer frame 11 to thereby support the end portions of the leadframes 13 and 15.

Since a method of fabricating an LED package in which the leadframes 60 and 70 are employed and an LED package fabricated through the method can be easily understood from the method of fabricating an LED package in which the leadframe 10 is employed and an LED package fabricated through the method, a description thereof will be omitted.

The invention claimed is:

1. A leadframe having heat sink supporting parts, comprising:
   an outer frame surrounding a region;
   first and second heat sink supporting parts extending into the region from opposing portions of the outer frame, each supporting part comprising a separate end portion configured to be directly coupled to a heat sink; and
   lead terminals extending into the region from opposing portions of the outer frame, the lead terminals being spaced apart from the supporting parts; and
   connection parts extending from the lead terminals to opposing portions of the outer frame,
   wherein the supporting parts are bent so that the end portions of the supporting parts are positioned at a different height than the lead terminals.

2. The leadframe as claimed in claim 1, wherein each of the lead terminals comprises:
   an outer lead extending from the outer frame into the region; and
   an inner lead extending from the outer lead into the region.

3. The leadframe as claimed in claim 2, wherein each of the end portions of the supporting parts extends between the inner leads.

4. The leadframe as claimed in claim 2, wherein the inner leads are configured to engage the heat sink and a width of the inner leads is smaller than a width of the outer leads.

5. The leadframe as claimed in claim 1, wherein a portion of the end portion of each of the supporting parts extends between the inner leads.

6. A light emitting diode (LED) package, comprising:
   a heat sink;
   first and second heat sink supporting parts, each supporting part comprising a separate end portion directly coupled to the heat sink;
   lead terminals spaced apart from the supporting parts and the heat sink and arranged at opposing sides of the heat sink;
   connection parts extending from opposing ends of the lead terminals; and
   a package main body molded around the heat sink, the supporting parts, the connection parts, and the lead terminals, the package main body comprising an opening for exposing a top end portion of the heat sink and portions of the lead terminals,
   wherein each of the supporting parts has a bent portion, the end portions of the supporting parts coupled to the heat sink are positioned at a different height than the lead terminals, and the bent portion is buried in the package main body, and
   wherein the lead terminals, the connection parts, and the supporting parts are exposed outside of the package main body.

7. The LED package as claimed in claim 6, wherein the heat sink comprises a body part and a projection protruding from a side surface of the body part, the projection is buried in the package main body, and the supporting parts are coupled to the body part.

8. The LED package as claimed in claim 7, wherein the heat sink has a supporting part receiving groove for accommodating the end portions of the supporting parts.

9. The LED package as claimed in claim 7, wherein a top surface of the body part of the heat sink is located at a position identical to or different from a top surface of the package main body.

10. The LED package as claimed in claim 7, wherein the heat sink further comprises a reflective cup positioned on the body part.

11. The LED package as claimed in claim 10, wherein a bottom surface of the reflective cup is located at a vertical position identical to or different from a top surface of the package main body.

12. The LED package as claimed in claim 6, wherein the package main body comprises thermosetting or thermoplastic resin.

13. The LED package as claimed in claim 6, wherein each of the lead terminals comprises:
   an inner lead that is curved to extend around the heat sink; and
   an outer lead extending from the inner lead and protruding from the package main body.

14. The LED package as claimed in claim 13, wherein each of the end portions of the supporting parts extends along a circumference of the heat sink between the inner leads.

15. The LED package as claimed in claim 6, wherein each of the lead terminals has an inner lead arranged around the heat sink and an outer lead extending from the inner lead, and the end portion of each of the supporting parts extends along a circumference of the heat sink between the inner leads.

16. The LED package as claimed in claim 13, wherein each outer lead protrudes from the package main body, and each outer lead is bent to a bottom surface of the package main body along a sidewall of the package main body.

17. The LED package as claimed in claim 6, further comprising:
an LED die mounted on a top surface of the heat sink; and
bonding wires for electrically connecting the LED die and the lead terminals.

18. The LED package as claimed in claim 17, further comprising molding resin for encapsulating the LED die and the bonding wires.

19. A method of fabricating an LED package, comprising the steps of:
preparing a leadframe that comprises an outer frame surrounding a region, first and second heat sink supporting parts extending into the region from opposing portions of the outer frame, each supporting part comprising a separate end portion to be coupled to a heat sink, lead terminals extending into the region from opposing portions of the outer frame and spaced apart from the supporting parts, and connection parts extending from the lead terminals to opposing portions of the outer frame;
coupling and fixing the heat sink to the supporting parts;
forming a package main body using an insert molding technique to support the heat sink and the lead terminals and the supporting parts around the heat sink; and
removing the outer frame by cutting the supporting parts, the connection parts, and the lead terminals,
wherein the package main body comprises an opening for exposing a top end portion of the heat sink and portions of the lead terminals,
wherein each of the supporting parts has a bent portion, the end portions of the supporting parts coupled to the heat sink are positioned at a different height than the lead terminals, and the bent portion is buried in the package main body.

20. The method as claimed in claim 19, further comprising the steps of:
mounting one or more LED dies on a top surface of the heat sink;
forming bonding wires to electrically connect the respective LED dies to the lead terminals; and
forming a molding member for encapsulating the LED dies and the bonding wires.

21. The method as claimed in claim 20, further comprising bending portions of the supporting parts and the lead terminals that are outside the package main body.

* * * * *